United States Patent
Robinson

(10) Patent No.: US 8,536,676 B2
(45) Date of Patent: Sep. 17, 2013

(54) CORONA PREVENTION IN HIGH POWER MMICS

(75) Inventor: Kevin L. Robinson, Clay, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 428 days.

(21) Appl. No.: 12/002,871

(22) Filed: Dec. 19, 2007

(65) Prior Publication Data
US 2009/0160021 A1 Jun. 25, 2009

(51) Int. Cl.
*H01L 21/02* (2006.01)

(52) U.S. Cl.
USPC .......... 257/532; 257/E21.008; 438/250; 438/329; 438/396; 438/439

(58) Field of Classification Search
USPC .......... 257/532, E21.008; 438/243, 329, 438/396, 439, 250
See application file for complete search history.

(56) References Cited

U.S. PATENT DOCUMENTS

| | | | |
|---|---|---|---|
| 5,812,364 A | 9/1998 | Oku et al. | |
| 6,008,083 A * | 12/1999 | Brabazon et al. | 438/239 |
| 6,081,415 A | 6/2000 | Crawford et al. | |
| 6,696,733 B2 * | 2/2004 | Koike et al. | 257/379 |
| 6,818,498 B2 * | 11/2004 | Mikawa et al. | 438/239 |
| 6,910,266 B2 * | 6/2005 | Lee et al. | 29/832 |
| 6,921,689 B2 * | 7/2005 | Matsuhashi | 438/240 |
| 7,098,501 B2 * | 8/2006 | Kong et al. | 257/306 |
| 7,973,246 B2 * | 7/2011 | Kuwajima | 174/261 |
| 2002/0000637 A1 * | 1/2002 | Gerhard | 257/528 |
| 2004/0246075 A1 * | 12/2004 | Bradley et al. | 333/187 |
| 2007/0063240 A1 * | 3/2007 | Torres et al. | 257/296 |
| 2007/0194384 A1 | 8/2007 | Robinson | |

OTHER PUBLICATIONS

International Search Report dated Feb. 24, 2009.
International Preliminary Report on Patentability dated Jun. 28, 2010.

* cited by examiner

*Primary Examiner* — John C Ingham
(74) *Attorney, Agent, or Firm* — Howard IP Law Group, PC

(57) ABSTRACT

The present invention is drawn to an MMIC capacitor comprising a dielectric material interposed between a metal top plate and a metal bottom plate; and a passivation layer having the composition of the dielectric material and applied to the capacitor components such that thickness of the layer eliminates a corona effect. The invention also includes a method for passivating a layer of SiN material onto a top plate having a thickness sufficient to reduce a corona effect dependent on an applied voltage.

14 Claims, 4 Drawing Sheets

CORONA PREVENTION IN HIGH POWER MMICS

FIELD OF INVENTION

The present invention relates to integrated circuits formed in semiconductor materials and in particular relates to methods and structures for forming corona protection in semiconductor substrates.

BACKGROUND

Monolithic microwave integrated circuits (MMICs) designed to operate at microwave frequencies are typically manufactured on top of single semiconductor substrates. As is generally the case with integrated circuits, placing the circuit components on a single substrate saves space. From an electronic standpoint, integrated circuits help reduce or eliminate problems such as parasitic capacitance loss that can arise when discrete devices are wire-bonded to one another to form circuits. These advantages can help integrated circuits operate at improved bandwidths as compared to circuits that are "wired" together from discrete components.

The growth of technologies dependent on MMICs will require that devices become smaller, more powerful and easier to manufacture. These desired advantages apply to base, relay and switching stations as well as to end user devices such as cellular telephones or other portable electronic devices. Due in part to the expansion of devices using MMICs, there may exist an increased need to raise operating voltages within the devices. In many applications MMIC capacitors are needed to work in the 140 volt (140 V) range and this figure is expected to increase significantly over the next several years. However, increasing operating voltages results in problems with AC and DC corona effects due at least in part to relatively high electric fields, notably in the space between the high voltage side of the capacitor and the nearest ground. These high voltage levels and the circuit features around such voltages result in electric field strengths sufficient to generate partial discharge and the onset of corona. Corona often cause catastrophic failure of the MMIC. Increasing the space between components will not offer solutions to most corona occurrences since corona induced failures are not caused by the spacing between the high voltage side of the capacitor and the ground via.

Alternative techniques and mechanisms for corona prevention in MMICs are desired.

SUMMARY OF THE INVENTION

In one embodiment of the invention a MMIC capacitor comprises a dielectric material interposed between a metal top plate and a metal bottom plate; and a passivation layer having the composition of the dielectric material and applied to the capacitor components such that thickness of the layer eliminates a corona effect. The invention also includes a method comprising passivating a layer of SiN material onto a top plate having a thickness sufficient to reduce a corona effect dependent on an applied voltage. The present invention is also drawn to using a MMIC capacitor comprising the steps of applying a dielectric material to encapsulate the MMIC capacitor and applying a voltage to the MMIC capacitor greater than 140 volts without causing damage to capacitor elements due to corona discharge.

BRIEF DESCRIPTION OF THE DRAWINGS

The invention is best understood from the following detailed description when read in connection with the accompanying drawings. The various features of the drawings are not specified exhaustively. On the contrary, the various features may be arbitrarily expanded or reduced for clarity. Included in the drawing are the following figures.

DETAILED DESCRIPTION

Figure 1:
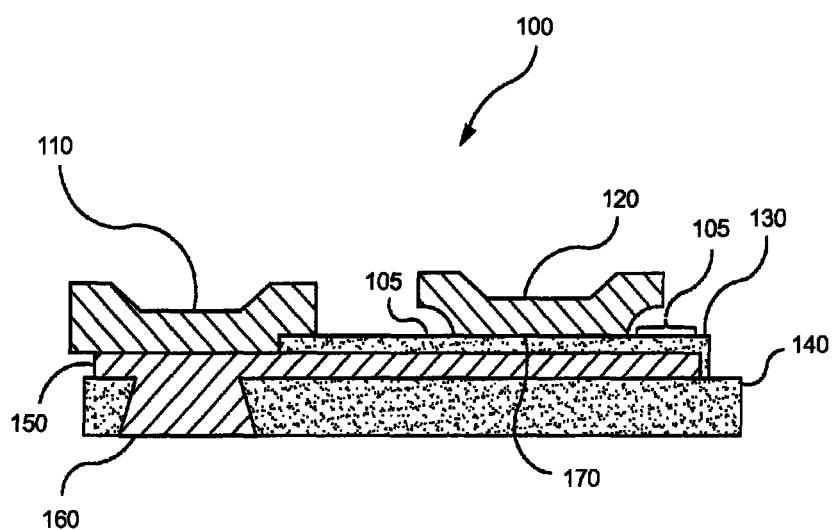
FIG. 1 is a plan view showing a prior art MMIC capacitor.

FIG. 1 illustrates a prior art MMIC capacitor 100 on a silicon carbide (SiC) substrate 140 and having a top plate 120, a dielectric material 130, such as silicon nitride SiN and a bottom plate comprised of a metal laminate 150 situated between a metal plate 110 and via 160. Via 160 serves to connect circuit metal laminate 150 to ground potential measured in relation to metal plate 120. Depending on the composition of the atmosphere (typically air or nitrogen) within which the electrical plates or components are situated, the geometrical shape of the electrical components (110, 120), and the dielectric material 130 and its thickness, potential voltage differences in excess of a given magnitude cause AC and DC coronas to occur in a region such as region 105 where the electric fields have the highest gradients and lines of concentration. As a frame of reference, the spacing between the top of the capacitor and the ground via metal is approximately 12 micrometers (12 um).

In the prior art depicted in FIG. 1 electric fields in the region 105 in excess of approximately 600 kilovolts per millimeter (600 KV/mm) in air produce damaging coronas.

Utilizing the configuration illustrated in FIG. 1, applying 120 Volts DC between the top plate 120 and the via 160 results in an electric field intensity due to fringing capacitance measured, at bottom most position 170 of the capacitor top plate, at approximately 600 kV/mm. A localized high electric field density of approximately 600 kV/mm in air causes a momentary partial discharge and in some instances a sustained corona. The high electric field intensity is believed due to the fringing fields at the capacitor and not the spacing between the top plate 120 of the capacitor and the ground via 160. An electric field intensity of 600 kV/mm is approximately four to ten times the maximum permissible value to prevent corona from occurring in an air environment.

Therefore, to prevent corona effects a minimum 150 kV/mm is desirable in the vicinity of the top plate 120 surface including the side walls and at the SiN junction at 170. The incorporation of an SiN passivation layer of thickness at least 1 um or greater and that conforms to the sides of the capacitor top plate 120 reduces the electric field to levels that inhibit the production of partial discharge and inception of corona in air. A thicker dielectric beneath the top plate 120 also reduces the electric field in the air that envelopes the top plate 120; however this approach affects capacitance.

One available option to reduce the effects of corona at high voltages is to increase dielectric thickness of dielectric material 130. However, increasing the dielectric material 130 thickness, although allowing for higher voltage operation and reducing electric field strength, also reduces capacitance per unit area. A greater area for a given capacitor results in a higher MMIC cost per capacitor. Another option to reduce the effects of corona at high voltages is to increase top conductor pullback region 105 to reduces surface flashover from the top electrode 120 to bottom the junction 170. This technique however, does not actually or effectively reduce the electric field strength near the capacitor in the region 105. Essentially increasing the pull back region 105 reduces the adverse DC corona effects, but not the AC corona adverse effects.

Figure 2:
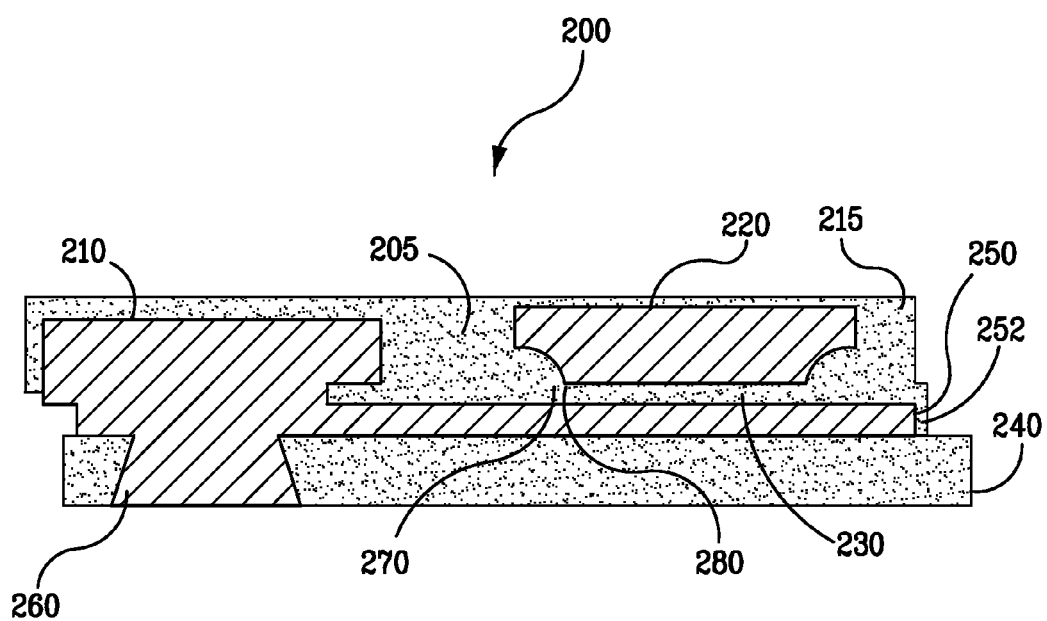
FIG. 2 is a plan view showing a MMIC capacitor according to an embodiment of the present invention.

FIG. 2 illustrates a non-limiting embodiment of the invention wherein an MMIC capacitor 200 comprises a dielectric material 230 interposed between a metal top plate 220 and a metal bottom plate 250, which rests on a SiC substrate 240; a passivation layer 215 encapsulates the exposed top plate 220 surface area and has a thickness sufficient to reduce a corona effect, thus eliminating a troublesome failure mode for high voltage MMIC capacitors. Adding the passivation layer 215 has the effect of increasing the voltage rating on the capacitor. The bottom metal plate is typically a metal laminate 250 such as gold, aluminum or copper situated between the top metal plate (e.g. 210) and metal via 260.

Via 260 serves to connect metal laminate 250 to a potential, which for illustration is considered ground in relation to metal plate 220. The region 205 composition is no longer filled by air or nitrogen, but consists of the passivation layer 215 having a certain minimum thickness relative to the space adjacent to the metal plate 220. The layer 215 has a dielectric constant which is nominally the same as the dielectric material 230 that serves as the dielectric material required for the capacitor to store electronic charge. By way of example only, such dielectric material may include SiN SiO, SiON and HfO. By a conformal filling of the volume of the region 205 with the dielectric material layer 215 the influence of the geometrical configuration of the electrical components (210, 220) is reduced and therefore the creation of electric fields that can cause inception and sustaining of AC and DC coronas in a region such as regions 205, 280 is eliminated. Essentially the introduction of the dielectric material passivation layer 215 reduces the electric field gradients in the lower breakdown air and lines of concentration to below those capable of producing corona effects. The introduction of dielectric material 215 moves the maximum electric field gradient in air to a location with reduced electric field gradient. In FIG. 2 electric fields in the region 270 in the approximate magnitude of 600 KV/mm do not produce damaging coronas because these fields are completely contained in the higher breakdown dielectric material.

Figure 3:
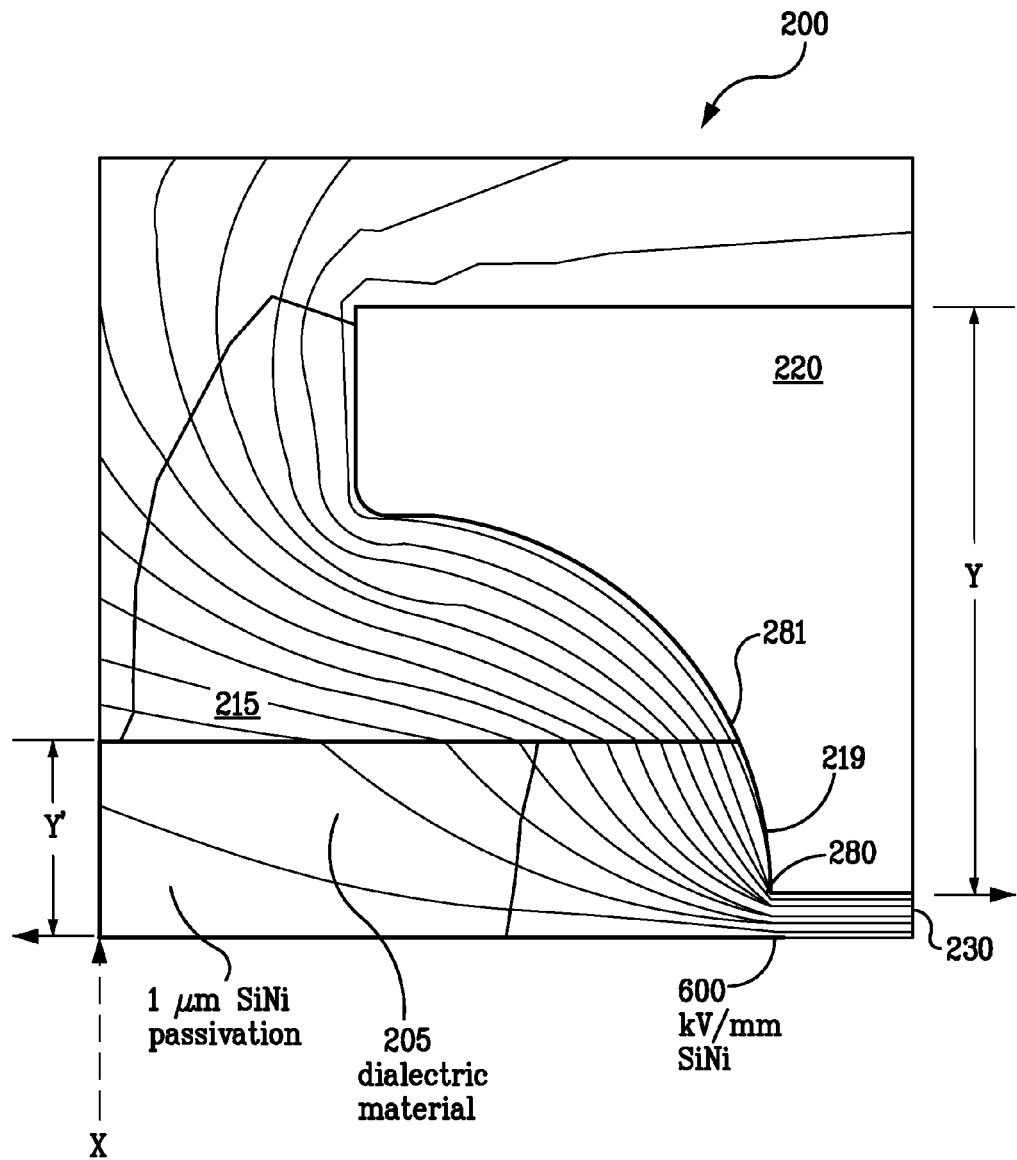
FIG. 3 is a magnified side view showing the exemplary MMIC capacitor of FIG. 2 showing gradients and lines of concentration according to an embodiment of the present invention.

FIG. 3 illustrates a magnified side view of an exemplary configuration in the region 205, 280 (see also, FIG. 2). The capacitor top plate is encapsulated in a volume of dielectric material layer 215 of an SiN passivation horizontally extending at least to a boundary designated X. In FIG. 3 the SiN passivation dielectric material 215 extends approximately 1 um vertically, designated as Y', up the left wall 219 of the metal plate 220. The electric field in the SiN dielectric material 230 is shown to be 600 kV/mm. The electric field adjacent to the region encapsulated by the SiN passivation 215, for example in the vicinity 281 adjacent to the dielectric material 230, is shown to be reduced to 140 KV/mm or a 4.3 times reduction in the strength of the electric field compared to the electric field in the prior art in air (FIG. 1).

The inventor has determined that a configuration of a least height dielectric material passivation layer 215 of dimension Y' relative to the top plate 220 vertical dimension Y sufficiently reduces the electric field strength to non corona levels. The high electric field strength of 600 kV/mm is completely contained in dielectric material capable of withstanding that electric field strength and not in air, which cannot support this level of electric field strength without corona. Furthermore, it is desirable that the passivation dielectric material layer 215 be of a material nominally the same composition as the dielectric material 230 or has the nominal equivalent of the dielectric constant as the dielectric material 230. In an exemplary embodiment, the dimensions X, Y, and Y' are 5 um, 4 um, and 1 um, respectively.

Figure 4:
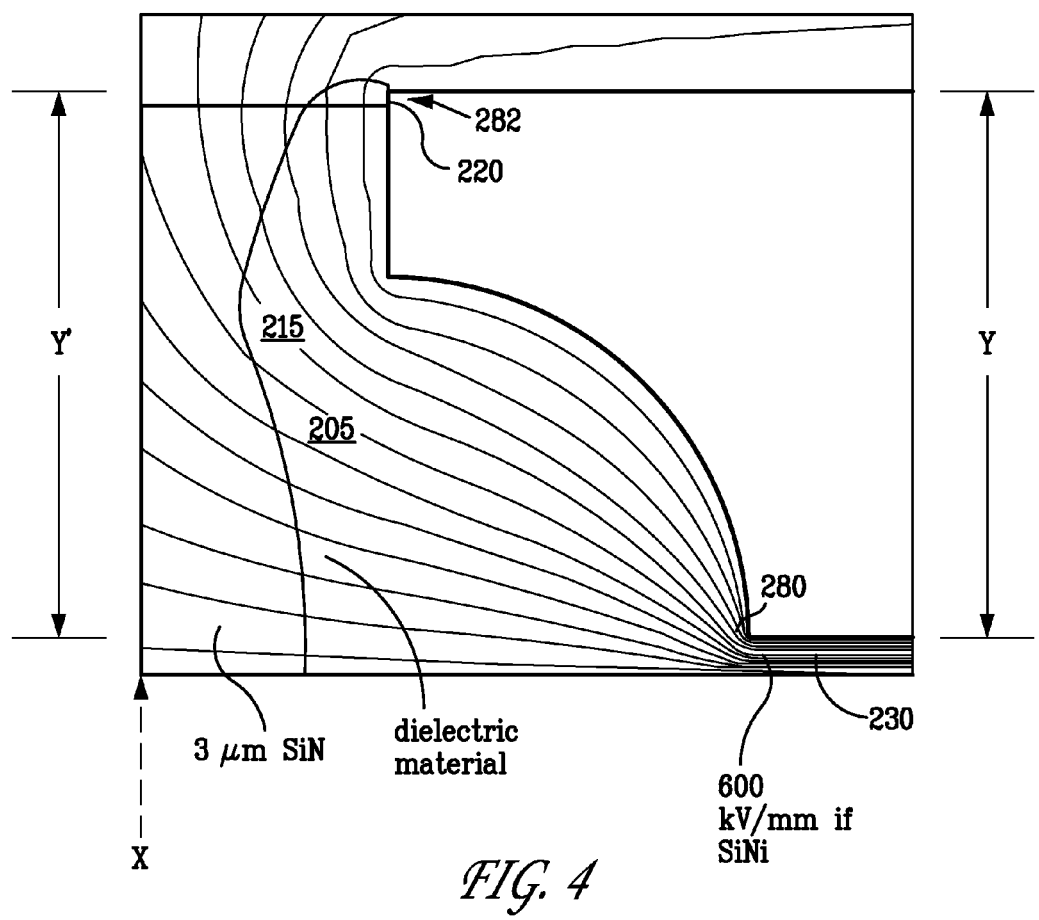
FIG. 4 is a magnified plan view showing a MMIC capacitor with gradients and lines of concentration according to an embodiment of the present invention.

In FIG. 4 a region 205, 280 is encapsulated in a volume of dielectric material layer 215 of an SiN passivation having a horizontal dimension extending at least to a boundary designated X. The SiN passivation is extended vertically (Y') up the wall of the metal plate 220 circuit trace at least 3 um in this example. The electric field in the SiN capacitor's dielectric material 230 is again shown to be 600 kV/mm. The electric field within the region encapsulated by the air layer 282 is shown to be reduced to 45 KV/mm or a 13.3 times reduction in the strength of the electric field compared to the electric field in the prior art (FIG. 1).

One embodiment of the invention is a method of producing a MMIC capacitor such as shown in FIG. 2 and FIG. 3 comprising the steps of: forming an SiN dielectric material on an SiC substrate, interposing a dielectric material such as dielectric material 230 between the metal top plate 220 and the metal bottom plate 250 in electrical contact with metal via 260; and encapsulating a portion of the top plate by passivating a layer 215 of SiN having a thickness Y' to reduce a corona effect.

In another embodiment of the invention a process comprises the steps of applying a coating of SiN or other suitable dielectric material at the point of maximum electric field strength such as shown in FIG. 2 to capacitor 200; encapsulating top metal conductor 220 and high electric field locations in dielectric material layer 215, thus reducing high electric field strengths surrounding the MMIC capacitor 200 elements and increasing the operating voltage on the MMIC capacitor 200 while eliminating damage to capacitor elements due to corona discharge.

In yet another embodiment, the invention relates to a process for using the MMIC capacitor 200 comprising the steps of: applying the coating of dielectric material layer 215 at the point of maximum electric field strength thereby encapsulating top conductor 220 and all high electric field locations surrounding the MMIC capacitor 200 and increasing the operating voltage on MMIC capacitor to greater than 50 volts without causing damage to capacitor elements due to corona discharge.

Thus, in accordance with embodiments of the present invention and with reference to FIG. 2, in a capacitor 200 having a substrate 240 containing a conductive via 260, a top conductor 220, and a bottom conductor 250 in electrical communication with the conductive via, and a metal via top plate 210 in electrical communication with the via 260 through the bottom conductor 250, a method of reducing corona effect comprises encapsulating the top conductor 220 and the metal via top plate 210 with a dielectric material 215. The method further comprises disposing the dielectric over an end wall 252 of the bottom conductor 250.

The foregoing invention has been described with reference to the above described MMIC embodiments having a capacitor with conductive plates and a dielectric. However the invention applies to any semiconductor having components affected by the production of electric fields that initiate and produce coronas. The foregoing invention applies, in addition to the monolithic microwave integrated circuit ("MMIC") described, to any circuit formed of a plurality of devices in which the circuit components are manufactured on top of a single semiconductor substrate, including fabrication incorporating elements such as but not limited to SiC, Gallium Nitride, Gallium Arsenide, Indium Phosphide, Silicon, Silicon Germanium or combinations thereof.

While the foregoing invention has been described with reference to the above described embodiment, various modifications and changes can be made without departing from the spirit of the invention. Accordingly, all such modifications and changes are considered to be within the scope of the invention.

What is claimed is:

1. A monolithic microwave integrated circuit (MMIC) capacitor comprising:
    a dielectric material interposed between a metal top plate and a metal bottom plate; and
    a passivation layer having the composition of the dielectric material comprising silicon nitride (SiN) and filling a cavity adjacent and conformal to at least one side wall of the top metal plate and between the at least one side wall and a point on the metal bottom plate closest to the at least one side wall, wherein a thickness of the passivation layer adjacent to said at least one side wall extends vertically up said at least one side wall and is at least 1 micron ($\mu$m) to reduce an electric field of approximately 600 kV/mm within the region of the SiN passivation layer by at least a factor of 4 to prevent a corona effect.

2. The capacitor of claim 1 wherein the passivation layer conforms to the outer surface of the capacitor.

3. The capacitor of claim 1 wherein the passivation layer conforms to the outer surface of the capacitor and fills the volume of the region adjacent to the capacitor.

4. The capacitor of claim 1 wherein the SiN passivation layer encapsulates the capacitor.

5. The capacitor of claim 1 wherein the SiN passivation layer extends vertically a distance of approximately 3 $\mu$m to reduce an electric field of approximately 600 kV/mm within the region of the SiN passivation layer by a factor of about 13.

6. The capacitor of claim 1 wherein the SiN passivation extending vertically reduces an electric field of approximately 600 kV/mm within the region of the SiN passivation layer by at least a factor of 10.

7. The capacitor of claim 1 wherein the passivation layer increases the voltage rating on the capacitor.

8. The capacitor of claim 1, wherein the passivation layer is in contact with the metal top plate at a top surface of the metal top plate, a bottom surface of the metal top plate, and at least one side surface of the metal top plate.

9. The capacitor of claim 8, wherein the passivation layer extends from at least one side of the metal top plate to at least one side of a neighboring electrical component.

10. The capacitor of claim 8, wherein the thickness of the passivation layer is a function of the separation distance between the metal top plate and a neighboring electrical component.

11. The capacitor of claim 8, wherein a portion of the metal top plate's side surface is curvilinear along a region of maximum electric field strength within the passivation layer.

12. A monolithic microwave integrated circuit (MMIC) capacitor comprising:
    a substrate containing a conductive via, top conductor, and a bottom conductor separated from said top conductor, said bottom conductor in electrical communication with said via, and
    a metal via top plate in electrical communication with said via through said bottom conductor, wherein
    said top conductor and said metal via top plate are encapsulated with a dielectric material comprising silicon nitride (SiN), said dielectric material having a thickness of at least 1 $\mu$m adjacent to and extending vertically up a side wall of said top conductor and conforming to the sides of said top plate conductor and being disposed between the sides of said top plate conductor and a point on said bottom plate conductor closest to the sides of said top plate conductor to reduce an electric field of approximately 600 kV/mm within the region of the SiN dielectric material by at least a factor of 4.

13. The capacitor of claim 12, wherein, the dielectric material is disposed over an end wall of the bottom conductor.

14. The capacitor of claim 12, wherein
    said top conductor has a surface area smaller than a surface area of said bottom conductor and at least one edge of said top conductor defines a pullback region relative to a corresponding edge of said bottom conductor, said pullback region being filled with said dielectric material.

* * * * *